United States Patent [19]

Chase et al.

[11] Patent Number: 6,017,679
[45] Date of Patent: Jan. 25, 2000

[54] COMPOSITION FOR THE MANUFACTURE OF FLEXOGRAPHIC PRINTING PLATES

[75] Inventors: Michael W. Chase, Arlington, Tex.; Milton Farber, Cheshire, Conn.; David T. Hughes, Whitney, Tex.

[73] Assignee: M.A. Hanna Company, Cleveland, Ohio

[21] Appl. No.: 09/150,889

[22] Filed: Sep. 10, 1998

Related U.S. Application Data

[63] Continuation-in-part of application No. 08/707,862, Sep. 9, 1996, Pat. No. 5,851,731.
[60] Provisional application No. 60/009,786, Jan. 12, 1996.
[51] Int. Cl.[7] ........................................ G03C 1/68
[52] U.S. Cl. .......................... 430/286.1; 430/281.1; 430/287.1; 430/306; 430/910; 430/18
[58] Field of Search ........................ 430/18, 306, 910, 430/281.1, 286.1, 287.1

[56] References Cited

U.S. PATENT DOCUMENTS

| | | | |
|---|---|---|---|
| 3,850,770 | 11/1974 | Juna et al. | 430/284.1 |
| 4,177,074 | 12/1979 | Proskow | 430/286.1 |
| 4,198,241 | 4/1980 | Bronstert et al. | 430/284.1 |
| 4,369,246 | 1/1983 | Chen et al. | 430/306 |
| 4,423,135 | 12/1983 | Chen et al. | 430/271.1 |
| 4,427,759 | 1/1984 | Gruetzmacher et al. | 430/273.1 |
| 4,452,936 | 6/1984 | Grimm | 524/322 |
| 4,460,675 | 7/1984 | Gruetzmacher et al. | 430/300 |
| 4,517,279 | 5/1985 | Worns | 430/286.1 |
| 4,604,343 | 8/1986 | Sakurai et al. | 430/281.1 |
| 4,894,315 | 1/1990 | Feinberg et al. | 430/281.1 |
| 4,946,752 | 8/1990 | Tomita et al. | 430/18 |
| 4,952,634 | 8/1990 | Grossman | 525/190 |
| 5,073,477 | 12/1991 | Kusuda et al. | 430/287.1 |
| 5,135,837 | 8/1992 | Swatton | 430/273.1 |
| 5,212,049 | 5/1993 | Gersdorf | 430/285.1 |
| 5,238,783 | 8/1993 | Taniguchi et al. | 430/281.1 |
| 5,304,458 | 4/1994 | Berrier et al. | 430/281.1 |
| 5,344,744 | 9/1994 | Ueda et al. | 430/287.1 |
| 5,364,741 | 11/1994 | Huynh-Tran et al. | 430/271.1 |
| 5,370,968 | 12/1994 | Goss et al. | 430/271.1 |

*Primary Examiner*—Janet Baxter
*Assistant Examiner*—Sin J. Lee
*Attorney, Agent, or Firm*—Killworth, Gottman, Hagan & Schaeff, LLP

[57] ABSTRACT

A water processable photopolymer composition for use in the manufacture of flexographic photopolymer printing plates is disclosed. The composition includes a flexible polymer having an affinity for water combined with a combination of hydrophilic and hydrophobic ethylenically unsaturated crosslinking agents or a single crosslinking agent containing both groups, a photoinitiator and swell enhancing components.

17 Claims, No Drawings

COMPOSITION FOR THE MANUFACTURE OF FLEXOGRAPHIC PRINTING PLATES

REFERENCE TO RELATED APPLICATIONS

This application claims the benefit of U.S. Patent Provisional Application Ser. No. 60/009,786, and is a continuation-in-part of U.S. patent application Ser. No. 08/707,862, now U.S. Pat. No. 5,851,731, issued Dec. 22, 1998, the disclosure of which is hereby incorporated by reference. Cross reference is also made to U.S. patent application Ser. No. 08/766,449 entitled "Higher Clarity Carboxylated Nitrile Rubber," naming Donald Charles Grimm as the inventor and filed on Dec. 12, 1996.

BACKGROUND OF THE INVENTION

This invention relates to improved photopolymer compositions suitable for use in the manufacture of flexographic photopolymer printing plates that are processed in aqueous media. The use of photopolymer compositions that are processed in organic solvents or in aqueous media for the manufacture of flexographic photopolymer printing plates is known, but existing photopolymer compositions processable in aqueous media have undesirable characteristics.

Compositions useful for the manufacture of flexographic photopolymer printing plates are generally made by blending a flexible polymer, an appropriate crosslinking agent, and a photoinitiator to allow room temperature reaction of the polymer with the crosslinking agent upon exposure of the blend to actinic radiation. Small amounts of other chemicals such as antioxidants, antiozonants, surfactants or dyes, are sometimes added.

"Actinic radiation" as used herein refers to radiation that initiates a chemical reaction and is intended to include ultraviolet radiation, electromagnetic wavelengths other than the ultraviolet and non-electromagnetic radiation such as electron beams. The use of actinic radiation to initiate a crosslinking reaction does not exclude the use of additional initiation methods, such as heat. Generally, flexographic photopolymer printing plates are photoinitiated using ultraviolet (UV) radiation.

In the flexographic photopolymer process, selected areas of the photopolymer are subjected to actinic radiation thereby crosslinking and insolubilizing them and then the image is developed by contacting the exposed sheet with a solvent which permeates the unreacted polymeric portion and causes it to swell and weaken. The reacted polymeric portions of the sheet being crosslinked remain unaffected because only a small amount of solvent can permeate those portions. The image made of reacted portions is thus revealed by removing at least part of the unreacted polymeric portion of the photopolymer sheet by contact with moving brushes or other means exposing the image. Typically, substantially all the uncrosslinked polymeric portion is removed. Then the developed sheet is removed from the development chamber and dried. Additional processing can occur. For example, the plate can receive further exposure to actinic radiation to insure complete crosslinking of any remaining unreacted components. The process for the manufacture of prior art flexographic printing plates is described in more detail in U.S. Pat. No. 4,369,246 to Chen.

The use of organic solvents for the processing of photopolymer plates (i.e., removal of unreacted polymer), however, has the drawback that environmentally sensitive solvents are typically used. These organic solvents are often flammable, relatively hazardous, and are highly regulated by most industrialized nations.

There is thus a need for the development of novel photopolymer compositions that can be processed in aqueous media to eliminate the use of organic solvents while maintaining the benefits of flexographic photopolymer printing plates processed in organic solvents.

The recent interest in this area of research and development has led to several attempts at aqueous processable photopolymers as described in, for example, U.S. Pat. No. 5,364,741 to Huynh-Tran, U.S. Pat. No. 4,517,279 to Worns, U.S. Pat. No. 4,177,074 to Proskow, and U.S. Pat. No. 4,198,241 to Bronstert. However, these "aqueous" photopolymer systems have a number of undesirable features especially a reliance on environmental sensitive components in their preferred developing solutions to achieve an acceptable processing rate. The preferred development solutions for these "aqueous" photopolymer systems also have a pH far from neutral. The Huynh-Tran system has a relatively low pH (pH of 2.4) and the Worns and Proskow systems have a relatively high pH (pH of 12.3). None of these "aqueous" photopolymer systems has effectively eliminated the use of environmentally sensitive or corrosive chemicals in the processing solutions.

Thus, there is a need for a water processable photopolymer composition, with acceptable processing characteristics and with physical properties suitable for use in flexographic photopolymer printing plate applications that can be processed in aqueous solutions that neither require the use of environmentally sensitive chemicals, nor extremely high or low pH.

SUMMARY OF THE INVENTION

Accordingly, it is an object of the invention to prepare a novel photopolymer composition which is suitable for processing in aqueous media free of either environmentally sensitive chemicals or extreme pH and which yields a suitable flexographic photopolymer printing plate.

As described above, the polymer blend suitable for use as a flexographic photopolymer printing plate generally includes a flexible polymer, a crosslinking agent, a photoinitiator, and swell enhancing components. Minor amounts of one or more antioxidants, antiozonants, stabilizers, process aids, and dyes may also be present.

Previous "aqueous processable" flexographic plates have relied on a combination of a flexible polymer or polymer blends having moderate swell rates in the presence of water with aggressive processing solutions, i.e. extreme pH or environmentally sensitive chemicals, to achieve acceptable processing rates.

Enhanced processing rates in more neutral aqueous solutions and good physical properties in accordance with the present invention have been achieved by combining a flexible hydrophilic polymer, a crosslinking agent which either contains both hydrophilic and hydrophobic groups or is a combination of hydrophilic and hydrophobic crosslinking agents, a photoinitiator, and swell enhancing components.

To process a flexographic photopolymer plate after the image has been exposed, the unexposed and therefore uncrosslinked portion must be softened and at least partially removed. Being uncrosslinked, the unexposed areas may be softened or dissolved by solvents, and are susceptible to removal with an abrading action. The crosslinked portions remain intact.

The composition of the invention is made up of a layer of the aforementioned water processable photopolymer composition and optionally, an integral or separate support layer.

DETAILED DESCRIPTION OF THE PREFERRED EMBODIMENTS

The preferred embodiment of the present invention is a photopolymer composition comprising the following:

A. A hydrophilic flexible polymer as exemplified by an acrylonitrile-butadiene-methacrylic acid terpolymer, commonly referred to as carboxylated nitrile rubber or a carboxylated acrylonitrile butadiene polymer, containing about 8–22% bound methacrylic acid. Preferably the hydrophilic flexible polymer also contains from about 1 to about 10 parts per hundred of at least one organic acid which contains at least three carboxyl groups.

B. A combination of hydrophilic and hydrophobic ethylenically unsaturated crosslinking agents or a single crosslinking agent containing both hydrophilic and hydrophobic constituents.

C. A photoinitiator.

D. Swell enhancing components.

Additional small amounts of materials such as antioxidants, antiozonates, stabilizers, processing aids, and dyes may also be included.

A. Flexible Hydrophilic Polymer

As used herein, "flexible hydrophilic polymer" (sometimes referred as a "flexomer") is a polymer that exhibits a water swell value of at least 100% when exposed to water for 22 hours or less at a temperature of 100° C. Preferably, the flexible hydrophilic polymer is a crosslinkable elastomeric polymer with functional groups that have an affinity for water. The affinity of a polymer for water can be measured by immersing the polymer in water at a predetermined temperature for a predetermined time and measuring the amount that the polymer swells. Some examples of suitable polymers are: copolymer of acrylonitrile and butadiene with acrylic or methacrylic acids, carboxylated copolymers of styrene and butadiene, and carboxylated polyisoprene or polybutadiene or blends of any two or more of such polymers. A specific example of a preferred flexible hydrophilic polymer is a copolymer of acrylonitrile, butadiene and methacrylic acid with a methacrylic acid content approximately equal to or greater than about 8% bound methacrylic acid.

Polymers suitable for the invention should have a swell value in water measured after 22 hours at 100° C. of at least about 100%. Table 1 illustrates the water swell after 22 hours at 100° C. of three commercially available carboxylated nitrile rubber polymers.

TABLE 1

% Volume Swell of Different Flexomers
(22 hours in deionized Water at 100° C.)

| Flexomer | Carboxyl Content | Vol. Swell |
|---|---|---|
| Krynac X7.50 (1) carboxylated acrylonitrile butadiene polymer | 7.0% | 75.8% |
| Krynac X9.50 (2) carboxylated acrylonitrile butadiene polymer | 9.0% | 88.5% |
| CEC X56932 (3) carboxylated acrylonitrile butadiene polymer | 16.8% | 139.3% |

(1) Krynac X7.50 ® is available from the Bayer Corporation.
(2) Krynac X9.50 ® is available from the Bayer Corporation.
(3) CEC X56932 ® is available from Chase Elastomer Corporation - Kennedale, Texas Polymers with higher swell rates are most effective in photopolymer compositions of the invention. Therefore, a bound methacrylic acid content higher than about 8% is preferred.

Prior art carboxylated nitrile rubbers such as are disclosed in U.S. Pat. No. 4,517,279 to Worns and U.S. Pat. No. 4,177,074 to Proskow, are limited to not more than 15% weight bound methacrylic acid content. In fact, lower amounts, such as 4% to 8%, are preferred in the above prior art.

Another factor in the selection of the preferred polymer is its acrylonitrile content. Acrylonitrile is known to be slightly hydrophilic and the selection of relatively high proportions of acrylonitrile enhances the aqueous processing of the plate. High acrylonitrile proportions however also increase the hardness of the processed plate and decrease the ink resistant properties which is undesirable. Therefore, the acrylonitrile content should be between from about 30% to about 50%, preferably not greater than about 45% and most preferably from about 30% to about 40%.

A particularly preferred polymer is made by Goodyear under the designation X56932, and available from Chase Elastomer Corporation as CEC X56932. It contains about 16.8% bound methacrylic acid. In addition to possessing a high degree of carboxylation, CEC X56932 also includes an organic acid which contains at least three carboxyl groups and an oligomerized fatty acid.

It is important for photopolymer compositions utilized in making printing plates to have a high degree of clarity so that ultraviolet light which is transmitted through a photographic negative can penetrate the composition and initiate crosslinking. It is also critical for the photopolymer composition to exhibit a high degree of water swell which allows for easy scrub-off of that part of the printing plate which was not crosslinked. There are also other mechanical requirements needed for such photopolymer compositions, such as flexibility and softness. Certain carboxylated nitrile rubbers, such as Krynac X7.50 ® carboxylated nitrile rubber which is sold by The Bayer Corporation offer most of the physical requirements needed from a base polymer for printing plate photopolymer compositions but Krynac X7.50 contains only about 7% bound methacrylic acid. In addition, such carboxylated nitrile rubbers do not have adequate clarity and are too water resistant for utilization in such applications. It is also important for carboxylated nitrile rubbers utilized in such applications to have a Mooney ML-4 viscosity at 100° C. of less than about 80.

U.S. Pat. No. 4,415,535, and U.S. Pat. No. 4,452,936 disclose techniques for preparing carboxylated nitrile rubbers which are suitable for making printing plate photopolymer compositions but do not possess adequate clarity and water swell characteristics. In the manufacture of such copolymers, U.S. Pat. No. 4,415,690 discloses the utilization of succinic anhydride derivatives as scorch inhibiting agents. U.S. Pat. No. 4,435,535 discloses the utilization of adipic acid as scorch inhibiting agent, and U.S. Pat. No. 4,452,936 discloses the utilization of oligomerized fatty acids as scorch inhibiting agents.

It has been determined that a carboxylated nitrile rubber which is suitable for use as a flexible polymer for printing plate photopolymer flexographic compositions can be made by using the process discussed below. This process differs from the process disclosed in U.S. Pat. No. 4,452,936 in several critical respects. For instance, the level of methacrylic acid incorporated into the carboxylated nitrile rubber is increased to within the range of about 8 weight percent to about 22 weight percent. It is also critical for the coagulation process carried out in recovering the carboxylated nitrile rubber from the latex to be accomplished without using polyelectrolytes, such as Nalco™ 108 polyelectrolyte, as coagulation aids. The addition of at least one organic acid which contains at least three carboxyl groups, such as citric acid or sodium citrate, to the carboxylated nitrile rubber is also critical. The organic acid is preferably added to the latex of the carboxylated nitrile rubber before coagulation but it can be added to the dry rubber after coagulation.

A preferred high clarity water sensitive carboxylated nitrile rubber composition is comprised of a carboxylated nitrile rubber which is composed of repeat units which are derived from about 33 weight percent to about 77 weight percent 1,3-butadiene, from about 15 weight percent to about 45 weight percent acrylonitrile, and from about 8 weight percent to about 22 weight percent methacrylic acid, and which contains an amount of an organic acid containing at least three carboxyl groups or the reaction product or products of an organic acid containing at least three carboxyl groups based on the addition to the latex or after coagulation of from about 1 phr to about 10 phr of at least one organic acid which contains at least three carboxyl groups. The preferred carboxylated nitrile rubber will typically have a Mooney ML-4 viscosity at 100° C. of less than about 80. In applications where scorch resistance is required the preferred carboxylated nitrile rubber composition will also contain from about 0.1 phr to about 7 phr of at least one oligomerized fatty acid.

The process for preparing the preferred high clarity water sensitive carboxylated nitrile rubber composition is described in U.S. patent application Ser. No. 08/766,449 filed Dec. 12, 1996, and comprises the steps of (1) free radical polymerizing from about 30 weight percent to about 60 weight percent 1,3-butadiene, from about 30 weight percent to about 50 weight percent acrylonitrile, and from about 8 weight percent to about 22 weight percent methacrylic acid in an aqueous polymerization medium in the presence of at least one emulsifier to produce a carboxylated nitrile rubber latex; (2) adjusting the pH of the carboxylated nitrile rubber latex to above 4 by the addition of a base to produce a pH adjusted carboxylated nitrile rubber latex; (3) distributing at least one saponified oligomerized fatty acid throughout the pH adjusted carboxylated nitrile rubber latex to produce a saponified oligomerized fatty acid containing pH adjusted carboxylated nitrile rubber latex; (4) coagulating the saponified oligomerized fatty acid containing pH adjusted carboxylated nitrile rubber latex by the additions of a combination of at least one strong inorganic acid, calcium chloride, and at least one organic acid which contains a least three carboxyl groups, to separate the wet carboxylated nitrile rubber composition from the aqueous phase; and (5) drying the wet carboxylated nitrile rubber composition to produce said high water sensitive carboxylated nitrile rubber composition.

The organic acid is used to keep the Mooney ML-4 viscosity of the carboxylated nitrile rubber composition below about 80. The Mooney ML-4 viscosity of the carboxylated nitrile rubber composition will typically be within the range of about 30 to about 70.

Carboxylated nitrile rubbers contain repeat units which are derived from 1,3-butadiene, acrylonitrile, and methacrylic acid. They can be synthesized by the free radical terpolymerization of the 1,3-butadiene, acrylonitrile, and methacrylic acid monomers under emulsion polymerization conditions. Such emulsion polymerizations generally utilize a charge composition which is comprised of water, the monomers, an initiator, and an emulsifier (soap). The emulsion polymerizations of this invention can be conducted over a very wide temperature range from about 0° C. to as high as about 100° C. It is normally preferred for the emulsion polymerizations of this invention to be carried out at a temperature which is within the range of about 5° C. to about 60° C. It is generally more preferred for the emulsion polymerization to be conducted at a temperature which is within the range of about 15° C. to about 30° C.

The ratio of monomers utilized in the charge composition can vary. However, the monomer charge composition will normally contain from about 30 to 73 weight percent 1,3-butadiene, from about 20 to 50 weight percent acrylonitrile, and from about 8 to about 22 weight percent methacrylic acid. The monomer charge composition will more typically contain from about 40 to about 52 weight percent 1,3-butadiene, from about 36 to about 44 weight percent acrylonitrile, and from about 12 to about 16 weight percent methacrylic acid. The monomer charge composition will preferably contain from about 43 to about 49 weight percent 1,3-butadiene, from about 38 to about 42 weight percent acrylonitrile, and from about 13 to about 15 weight percent methacrylic acid.

The charge composition used in the preparation of the latices of this invention will contain a substantial quantity of water. The ratio between the total amount of monomers present in the charge composition and water can range between about 0.2:1 and 1.2:1. It is generally preferred for the ratio of monomers to water in the charge composition to be within the range of about 0.8:1 and about 1.1:1. For instance, it is very satisfactory to utilize a ratio of monomers to water in the charge composition of about 1:1.

The charge composition will also normally contain from about 0.5 phm (parts per hundred parts by weight of all monomers) to about 6 phm of at least one emulsifier. It is normally preferred for the emulsifier to be present in the polymerization medium at a level within the range of about 1 phm to about 5 phm. It is generally more preferred for the charge composition to contain from about 2 to about 4 phm of the emulsifier.

The emulsifiers used in the polymerization of this invention may be charged at the outset of the polymerization or may be added incrementally or by proportioning as the reaction proceeds. Generally, anionic emulsifier systems provide good results; however, any of the general types of anionic, cationic or nonionic emulsifiers may be employed in the polymerization.

Among the anionic emulsifiers that can be employed in the emulsion polymerizations of this inventions are fatty acids and their alkali metal soaps such as caprylic acid, capric acid, pelargonic acid, lauric acid, undecylic acid, myristic acid, palmitic acid margaric acid, stearic acid, arachidic acid, and the like; amine-soaps of fatty acids such as those formed from ammonia, mono- and dialkyl amines, substituted hydrazines, guanidine and various low molecular weight diamines; chain-substituted derivatives of fatty acids such as those having alkyl substituents; nathpthenic acids and their soaps and the like; sulfuric esters and their salts, such as the tallow alcohol sulfates, coconut alcohol sulfates, fatty alcohol sulfates, such as oleyl sulfate, sodium lauryl sulfate and the like; sterol sulfates; sulfates of alkylcyclohexanols, sulfated products of lower polymers of ethylene as $C_{10}$ to $C_{20}$ straight chain olefins and other hydrocarbon mixtures, sulfuric esters of aliphatic and aromatic alcohols having intermediate linkages, such as ether, esters or amide groups, alkylbenzyl (polyethyleneoxy) alcohols, the sodium salt of tridecyl ether sulfate, alkane sulfonates esters and salts, such as alkylchlorosulfonates with the general formula $RSO_2$—Cl, wherein R is an alkyl group having from 10 to 20 carbon atoms and alkylsulfonates with the general formula $RSO_2$—OH wherein R is an alkyl group having from 1 to 20 carbon atoms; sulfonates with intermediate linkages such as ester and ester-linked sulfonates such as those having the formula $RCOOC_2H4SO_3H$ and ROOC—$CH_2$—$SO_3H$, wherein R is an alkyl group having from 1 to 20 carbon atoms such as dialkyl sulfosuccinates; ester salts with the general formula:

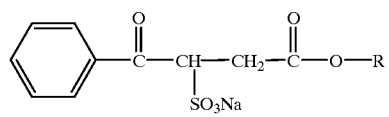

wherein R is an alkyl group having from 1 to 20 carbon atoms; alkaryl sulfonates in which the alkyl groups contain preferably from 10 to 20 carbon atoms, e.g. dodecylbenzenesulfonates, such as sodium dodecylbenzenesulfonates; alkyl phenol sulfonates; sulfonic acids and their salts such acids with the formula $RSO_3Na$, wherein R is an alkyl and the like; sulfonamides; sulfamido methylenesulfonic acids, rosin acids and their soaps; sulfonate derivatives of rosin and rosin oil; and lignin sulfonates and the like.

Rosin acid soap has been used with good success at a concentration of about 5 percent by weight in the initial charge composition used in the synthesis of carboxylated elastomers. Of rosin acids, about 90 percent are isometric with abietic acid and the other 10 percent is a mixture of dehydroabietic acid and dihydroabietic acid.

The polymerization may be initiated using free radical catalysts, ultraviolet light or radiation. To ensure a satisfactory polymerization rate, uniformity and a controllable polymerization rate, free radical initiators are generally used. Free radical initiators which are commonly used include the various peroxygen compounds such as potassium persulfate, ammonium persulfate, benzoyl peroxide, hydrogen peroxide, di-t-butyl peroxide, dicumyl peroxide, 2,4-dichlorobenzyl peroxide, decanoyl peroxide, lauroyl peroxide, cumene hydroperoxide, p-menthane hydroperoxide, t-butylhydroperoxide, acetyl acetone peroxide, methyl ethyl ketone peroxide, succinic acid peroxide, dicetyl peroxydicarbonate, t-butyl peroxyacetate, t-butyl peroxymaleic acid, t-butyl peroxybenzoate, acetyl cyclohexyl sulfonyl peroxide and the like; the various azo compounds such as 2-t-butylazo-2-cyanopropane, dimethyl azodiisobutyrate, azodiisobutyronitrile, 2-t-butylazo-I-cyanocyclohexane, 1-t-amylazo-1-butylazo-1-cyanocyclohexane, 1-t-amylazo-1-cyanocyclohexane and the like; the various alkyl perketals, such as 2,2-bis-(t-butylperoxyl)butane, ethyl 3,3-bis(t-butylperoxy) butyrate, 1,1-di-(t-butylperoxy) cyclohexane and the like. Cumene hydroperoxide is a highly preferred initiator.

After the desired degree of monomer conversion has been attained a conventional shortstopping agent, such as hydroquinone, can be added to the polymerization medium to end the polymerization. The polymerization will typically be allowed to continue until high level conversion has been achieved. In most cases the monomer conversion reached will be at least about 75 percent with monomer conversions of at least about 80 percent being preferred.

After the polymerization has been completed the latex will typically have a pH which is within the range of about 3 to about 4. At pH values of less than about 4 saponified oligomerized fatty acids are only marginally soluble in latex. At lower pH levels saponified oligomerized fatty acids are converted to free acids which are insoluble in water. Accordingly the pH of the latex will typically be adjusted to a level above about 4 by the addition of a base, such as ammonium hydroxide, sodium hydroxide, or potassium hydroxide.

After the pH of the latex has been increased to a level of greater than 4, one or more saponified oligomerized fatty acids are added to the latex. Measures should be taken to insure that the saponified oligomerized fatty acids are well distributed throughout the latex. The saponified oligomerized fatty acids can be added to the latex just before coagulation if sufficient time is allowed for proper mixing to result.

In most cases from about 0.1 phr (parts per hundred parts of rubber) to about 7 phr of saponified oligomerized fatty acids will be distributed throughout the latex. It is typically preferred to add about 0.5 phr to about 3 phr of the saponified oligomerized fatty acids to the latex. As a general rule it is more preferred to distribute from about 0.7 phr to about 1.4 phr of the saponified oligomerized fatty acids throughout the latex. It is most preferred to distribute about 0.8 phr of the saponified oligomerized fatty acids throughout the latex.

The oligomerized fatty acids which can be used are normally oligomers of fatty acids which contain 18 carbon atoms, such as oleic acid and linoleic acid. The actual preparation, properties, and structures of dimerized $C_{18}$ fatty acids are described in U.S. Pat. No. 2,347,562 and Cowan, John C. and Wheeler, Donald H., "Linear Superpolymers from Dilinoleic Acid," *The Journal of the American Chemical Society*, Vol. 66. Pages 84–88 (1944).

Several different grades of oligomerized $C_{18}$ fatty acids are available commercially which vary in monomer, dimer, and trimer content. For example, oligomerized acids are available from Emery Industries, Inc., under the trade name, Empol™. Empol 1010 contains 97 percent dimer acids and 3 percent trimer acids. Empol 1014 contains 95 percent dimer acids, 4 percent trimer acids and 1 percent of the fatty acid monomers. Empol 1016 contains 87 percent dimer acids, 13 percent trimer acids and a trace of monomer. Empol 1018 contains 83 percent trimer acids, 17 percent dimer acids and a trace of monomer. Empol 1041 contains 90 percent trimer acids and 10 percent dimer acids. Empol 1052 contains 40 percent dimer acids and 60 percent trimer and polybasic acids. Trimerized $C_{18}$ fatty acids have a molecular weight of about 850, contain 54 carbon atoms and have three carboxyl groups. The preferred oligomerized fatty acid is available from Emery Industries under the designation Empol 1022.

Any combination of any or all of the aforementioned types of oligomers of fatty acids can be used to provide excellent scorch safety when distributed throughout a carboxylated rubber. Oligomerized fatty acids are water insoluble materials. Thus, they must be saponified with a base to become soluble in water or in the carboxylated nitrile rubber. The oligomerized fatty acids can be readily saponified by reacting them with bases, such as aqueous potassium hydroxide, sodium hydroxide, or ammonium hydroxide to yield the water-soluble salt of the oligomerized fatty acid. These salts can then be further reacted with other bases, for example, calcium chloride to yield the calcium salt of the oligomerized fatty acids.

After the saponified oligomerized fatty acids are distributed throughout the latex, the carboxylated nitrile rubber can be recovered by coagulation. This coagulation will result in the conversion of the saponified oligomerized fatty acids to free acids which are insoluble in the fatty phase, but which will remain in the carboxylated nitrile rubber. The coagulation is accomplished by adding to the latex at least one strong inorganic acid, calcium chloride, and at least one organic acid which contains at least three carboxyl groups. The strong inorganic acid will typically be sulfuric acid and the organic acid will typically be citric acid. The calcium chloride will normally be added in an amount which is within the range of about 13 phr to about 40 phr.

The organic acid will normally be added to the latex in an amount of about 1 phr to about 10 phr of the organic acid based on the dry weight of the carboxylated nitrile rubber after coagulation. However, the organic acid can be added in whole or in part to the dry carboxylated nitrile rubber (after coagulation) to realize the desired quantity of the organic acid in the dry rubber. As a general rule, it is preferred for about 1.5 phr to about 5 phr of the organic acid to be added to the latex containing the carboxylated nitrile rubber. It is normally more preferred for about 2 phr to about 4 phr of the organic acid to be added to the latex containing the carboxylated nitrile rubber.

After coagulation, washing can be employed to remove excess soap and/or electrolyte from the carboxylated nitrile rubber. Sometimes washing is also useful in adjusting the pH of the carboxylated elastomer that has been synthesized and recovered from the latex. After washing the carboxylated nitrile rubber will normally be dewatered using standard techniques. It is then dried by employing standard procedures, such as passing warm dry air through it. After being dried, it can be utilized as a base polymer in making photopolymer compositions for printing plates utilized in flexographic printing applications.

The ratio of bound monomers in the carboxylated nitrile rubber can vary from the monomer charge ratios utilized in the synthesis of the polymer due to differences in the polymerization rates of the monomers. Thus, the carboxylated nitrile rubber can have a different ratio of repeat units which are derived from the various monomers than was utilized in the monomer charge. The carboxylated nitrile rubbers of this invention will typically have repeat units which are derived from about 33 weight percent to about 77 weight percent 1,3-butadiene monomer, from the 15 weight percent to about 45 weight percent acrylonitrile monomer, and from about 8 weight percent to about 22 weight percent methacrylic acid. The carboxylated nitrile rubbers of this invention will more typically have repeat units which are derived from about 44 weight percent to about 56 weight percent 1,3-butadiene monomer, from about 30 weight percent to about 38 weight percent acrylonitrile monomer, and from about 14 weight percent to about 18 weight percent methacrylic acid. The carboxylated nitrile rubbers of this invention will preferably have repeat units which are derived from about 47 weight percent to about 53 weight percent 1,3-butadiene monomer, from about 30 weight percent to about 36 weight percent acrylonitrile monomer, and from about 15 weight percent to about 17 weight percent methacrylic acid.

While the preferred polymer is highly swellable in water and otherwise suitable for the manufacture of flexographic printing plates, it is desirable to have a higher processing rate in aqueous solutions at a pH in the range of 3 to 12 than this polymer alone achieves.

In the present invention, the preferred aqueous solution can have a pH in the range of 3 to 12. A more preferred pH range is 7 to 12, while the most preferred range is 9.5 to 11.5.

B. The Crosslinking Agent

The processing rate in aqueous media of the instant photopolymer composition is enhanced by use of hydrophilic crosslinking agents. The processing rate is further enhanced by use of a blend of both hydrophilic and hydrophobic crosslinking agents or by a crosslinking agent with both hydrophilic and hydrophobic constituents.

As used herein, "crosslinking agent" means a molecule that has at least two functional groups capable of reacting with two or more molecules of the polymer to create a flexible crosslinked polymer network having a substantially greater molecular weight than the flexible hydrophilic polymer. Unless clearly excluded by the context, the term crosslinking agent includes a single crosslinking agent or blends of two or more crosslinking agents.

Classes of presently preferred suitable crosslinking agents are: a) ethoxylated hydrophilic crosslinking agents, b) propoxylated hydrophobic crosslinking agents, and c) combinations of ethoxylated and propoxylated crosslinking agents. Detailed lists of crosslinking agents are given in U.S. Pat. No. 5,364,741 to Huynh-Tran and U.S. Pat. No. 4,177,074 to Proskow, which are incorporated herein by reference.

A highly suitable crosslinking agent blend includes both an ethoxylated triacrylate sold as SR9035™ by the Sartomer Company of Exton, Pa. (with a molecular weight of approximately 1000) which is a hydrophilic crosslinking agent and a propoxylated diacrylate sold as SR9003B™ by the Sartomer Company (with a molecular weight of approximately 300) which is a hydrophobic crosslinking agent. It has been found that a blend of hydrophilic and hydrophobic crosslinking agents provides a faster processing rate than either a hydrophilic or hydrophobic crosslinking agent alone. A most preferred crosslinking agent is available from the Sartomer Company under the designation SR9038™ which is an ethoxylated bisphenol A diacrylate, which is both hydrophilic and hydrophobic.

The crosslinking agent or blend of crosslinking agents is preferably used in an amount not greater than about 100 php (parts per hundred polymer) as based on the amount of hydrophilic flexible polymer present in the photopolymer compositions. When used in a blend, the hydrophilic crosslinking agent component is preferably used in amounts not greater than about 50 php. More preferably it is used in an amount in the range of about 5 php to about 30 php. Most preferably, it is used in an amount in the range of about 10 php to about 20 php.

The hydrophobic crosslinking agent component is preferably used in amounts not greater than about 50 php. More preferably, it is used in an amount in the range of about 5 php to about 30 php. Most preferably, it is used in an amount in the range of about 10 php to about 20 php.

When using a crosslinking agent such as Sartomer's SR9038™ which has both hydrophilic and hydrophobic functionality, the preferred amount is not greater than about 100 php. More preferably, this type of crosslinking agent is used in an amount in the range of about 10 php to about 60 php. Most preferably, this type of crosslinking agent is used in an amount in the range of about 20 php to about 40 php.

When a blend of hydrophilic and hydrophobic crosslinking agents is used, the weight ratio of the hydrophilic crosslinking agent to hydrophobic crosslinking agent is preferably in the range of about 75:25 to about 25:75. More preferably, the weight ratio of hydrophilic crosslinking agent to hydrophobic crosslinking agent is in the range of about 66:33 to about 33:66. Most preferably, the weight ratio of hydrophilic crosslinking agent to hydrophobic crosslinking agent is about 54:45 to 45:55.

C. The Photoinitiator

Another ingredient of the water processable photosensitive compositions is an actinic radiation activated free radical generating molecule referred to in the industry as a photoinitiator. It is not believed that the particular photoinitiator is critical, and any photoinitiator that produces an acceptable reaction rate upon exposure to actinic radiation can be used. Photoinitiator activators such as acrylated amines may be used in conjunction with conventional photoinitiator. Detailed lists of available photoinitiators are given in U.S. Pat. Nos. 5,496,684 and 5,496,685 to Farber and Hughes. The preferred photoinitiator is a benzyl dimethyl ketal. The photoinitiator is preferably used in an amount of less than about 10 php. Most preferably, the photoinitiator is used in the amount of 0.5 php to about 5 php.

D. The Swell Enhancing Components

1. Hydrophilic Additives As Swell Enhancing Components

The use of hydrophilic additives as swell enhancing components in the instant invention causes the photopolymer composition to swell and process faster in an aqueous solution than a composition containing conventional crosslinking agents and photoinitiators alone. Yet, surprisingly, the swell enhancing components do not degrade the properties of the plate in use.

As used herein, "compatible swell enhancing component" means one or more chemicals that substantially increases the volume swell in water of a photopolymer composition to which it is added over any swell in the absence of such compatible swell enhancing component, while producing a photopolymer composition with acceptable clarity, flexibility, ink resistance, surface tack, and mechanical cohesiveness.

The higher processing rates of the combination of a water swellable polymer blend and one or more swell enhancing components can be shown by the fact that the combination swells more in water than the polymer alone under the same conditions. For the preferred compositions, the percent volume swell for the photopolymer composition is greater in deionized water at 70° C. than the polymer alone at 100° C. after 22 hours. Thus, unexpectedly, a new composition of matter has been discovered that allows processing of flexographic photopolymer printing plates at acceptable rates in an aqueous solution with a pH less than 12 and greater than 3 and which does not require environmentally sensitive components in the processing solution.

Swell enhancing components include organic compounds containing functional groups which are recognized as hydrophilic such as $—NH_2$, $—OH$, and $—COOH$. See also "*Structural Design of Water Soluble Copolymers*", McCormick, published in the American Chemical Society Symposium Series, Number 467, 1989, for a discussion of hydrophilic functional groups.

The compounds used as swell enhancing components must be compatible with the hydrophilic flexible polymer and/or with each other. If the polymer and the swell enhancing components are not sufficiently compatible, the composition will be hazy, may have an oily surface, or may not form a cohesive sheet. Desired attributes in the swell enhancing components thus include the ability to adequately blend into the photopolymer composition to form a sheet with attributes suitable for the expected processing steps, as well as when in use. If desired, one or two or more hydrophilic additives may be used together to form a compatible swell enhancing component. The use of hydrophilic additives as swell enhancing components in this invention allows processing of both the crosslinked and uncrosslinked portions of the photopolymer composition, because the uncrosslinked portions wash out as desired while the crosslinked portions do not wash out.

When a single hydrophilic additive is used as the swell enhancing component, it is preferably used in amounts not less than about 1 php and not greater than about 100 php. Most preferably, a swell enhancing additive is present in the amounts not less than 5 php and not greater than about 30 php.

The hydrophilic additive may be a hydrophilic plasticizer which possesses a molecular weight of from about 400 to about 200,000, preferably from about 400 to about 20,000, most preferably from about 400 to about 800. Unexpectedly, we have found that the most preferred molecular weight range yields not only the best processability but also maintain the desirable properties of flexibility, softness and low swell rates in printing inks. A single additive such as a compatible swell enhancing plasticizer which combines the functions of swell enhancement and processability may also be used.

Acceptable swell enhancing hydrophilic plasticizers include: a) ethylene oxide condensates, b) propoxylated polyglycols and other polypropylene oxide condensates, c) methoxy polyethylene glycols, d) blends of ethoxylated and propoxylated polyglycols, e) amino polyglycols. An ethoxylated polyglycol with a molecular weight of about 400 is commercially available from the Dow Chemical Company of Midland, Michigan under the name E400™ and from Union Carbide Chemicals & Plastics under the name PEG400™. A methoxy polyethylene glycol, MPEG750™ with a molecular weight of 750 is available from Union Carbide Chemicals & Plastics. An example of an ethylene oxide condensate is polyethylene oxide. Polyethylene oxides vary in molecular weight from about 100,000 to several million with the lower molecular weights preferred, i.e., about 100,000 to about 200,000. As such this hydrophilic plasticizer can be considered a swell enhancing filler. A specific example of a swell enhancing component of this type is Polyox N-10™, available from the Union Carbide Chemicals and Plastics Company. It should be noted that the higher molecular weight polyethylene oxide resins make suitable photopolymer compositions, but the wash rates are less than for the lower molecular weight versions. Polyethylene oxides with molecular weights significantly below about 100,000 are less preferred as they may lead to degradation of the reacted portion of the plate during processing and use.

When using a polyethylene oxide, it is preferably present in amounts not less than about 2 php and not greater than about 50 php. More preferably, the polyethylene oxide is present in amounts not less than about 5 php and not greater than about 30 php. Even more preferably, this is present in amounts not less than about 10 php and not greater than about 20 php. Most preferably, polyethylene oxide is used in the amount of 15 php.

2. Hydrophobic Plasticizers As Swell-Enhancing Components

Surprisingly, it has been found that hydrophobic plasticizers may be incorporated into the hydrophilic photopolymer compositions of this invention and provide excellent resistance to extraction and a higher wash out speed, thus preserving the desired physical properties. While these materials do not enhance the volume swell as such, they serve as processing aids and complement the other swell enhancing components and, therefore, are included as one of the swell enhancing components. Further, these materials may also be considered "compatibilizers" in that such materials have the characteristic of making the water processable photopolymer composition components "compatible" with each other and giving the composition necessary proportions for processing.

Materials which are suitable as hydrophobic plasticizers include: a) glycol esters such as propane diol dibenzoates, polypropylene glycol dibenzoates, triethylene glycol caprylate, tetraethylene glycol caprylate, tri and tetraethylene glycol dipelargonates, diethylene glycol monolaurates: b) thioglycol esters, i.e., dibutyl methylene bis-thioglycolate, known as Vulkanol 88® available from Bayer Corporation: c) aromatic esters such as diethyl hexyl phthalate, trioctyl trimallitate and the like. Preferred hydrophobic plasticizers are from the glycol ester family. A specific example is dipropylene glycol dibenzoate, known as K-Flex DP, manufactured by Kalama.

The hydrophobic plasticizer is preferably used in amounts not greater than about 50 php. Most preferably, the hydrophobic plasticizer is used in amounts not less than about 5 php and not greater than about 25 php.

3. Surfactants As Optional Swell Enhancing Components

A more preferred photopolymer composition includes both a hydrophobic plasticizer and a surfactant. Surfactants that are compatible with the other elements of the photopolymeric composition may be used. A specific example is a photopolymer composition containing a surfactant called Tween 20 available from ICI Surfactants.

When a surfactant is used, it is preferably used in amounts not greater than 20 php More preferably, a surfactant is used in amounts not less than about 1 php and not greater than about 10 php. Even more preferably, a surfactant is used in amounts not less than 2 php and not greater than about 8 php. Most preferably, a surfactant is used in the amounts of about 5 php.

Washout Rates

The washout rate test is preformed by taking a sheet of unexposed and uncrosslinked water processable photopolymer composition and running it in a photopolymer plate washout unit. After a predetermined time, the sample is removed from the washout unit. The decrease in thickness in thousandths of an inch divided by the time (in minutes) defines the washout rate in thousandths of an inch per minute. A minimum washout rate of 0.0010 in/min is acceptable. Higher washout rates are preferred when coupled with acceptable engineering and use characteristics.

Characteristics and Physical Properties of Flexographic Photopolymer Printing Plates The most viable water washable photopolymer composition will possess both acceptable processing characteristics for imaging and development, and superior physical properties for performance and long life in use. Preferably, a photopolymer composition will have a Shore A hardness of not less than 25, and not greater than 65.

Methods of Production

The water processable photopolymer compositions of the invention can be produced via several standard methods known in the industry. The selected components may be blended into a homogenous material in any type of suitable mixing equipment, such as: open mills, internal mixers, compounding extruders, dissolution, or other types known in the industry. These water processable photopolymer compositions correspondingly can be formed into useable sheets of industry standard thicknesses by known methods. These forming methods include: extrusion and calendering at ambient or elevated temperatures, hot pressing, solvent casting, or other means known in the industry.

Washout Solutions

The recommended washout solutions for use with the photopolymer compositions of the present invention are all based on at least 95% water by weight,. The remaining components of the washout solutions are composed of salts, surface active agents, pH modifiers and other environmentally friendly compositions with the requirement that the pH is maintained at greater than 3 and less than 12.

A non-exhaustive list of salts which enhance the washout rates includes: a) ammonium and other common cation salts of benzene sulfonic acid: b) sodium and other common cation carbonates, bicarbonates, sesquicarbonates, sulfates, or phosphates, and other compounds which can be added to modify the pH.

A non-exhaustive list of surface active agents used in the washout solution includes: a) a commercially available cleaning solution, known as Microclean™, which is a blend of salts, soaps and surfactants: b) another commercially available surfactant, known as Tween 20™, available from ICI Surfactants, and others in its class, and: c) other compounds which can be added to solutions to initiate detergent or micelle effects.

A non-exhaustive list of other additives to enhance the washout rate includes: a) household ammonia solution: b) a commercially available environmentally safe cleaning solution, known as Phoenix™ (a blend of salts, soaps, surfactants, glycol ethers and alkali), available from Albar Labs, Fort Worth, Tex., and: c) other types of chemicals in this class which not only swell the composition, but slightly alter the pH of the solution, both of which enhance the resulting washout rate of the photopolymer composition. Such materials also include common detergents such as Cascade™.

The preferred washout solution is both non-hazardous and effective to produce acceptable washout rates when the combination of salts, surfactants, and pH modifiers have an overall pH preferably within the range of 9.5 to 11.5.

Higher washout rates may be obtained using higher temperature. A washout temperature not greater than about 60° C. and not less than about 40° C. is preferred.

EXAMPLE 1

The following water washable photopolymer composition was mixed on a two-roll open mill

| Formulation Component (php)* | |
|---|---|
| Flexible Polymer Blend | |
| Flexible Polymer CEC X56932 (1) | 100 |
| Crosslinking Agent Sartomer SR9038 (2) | 30 |
| Photoinitiator Sartomer KB-1 (3) | 2 |
| Hydrophilic Plasticizer Carbowax M PEG 750 (4) | 10 |
| Hydrophobic Plasticizer K-Flex DP (5) | 10 |

It was then compression molded into a 0.067" (1.70 mm) sheet with a 0.005" (0.13 mm) polyester film support on the bottom and a 0.0002" (0.005 mm) protective slip film on top. This sheet was then exposed to UV light for 8 minutes through a black and white transparency containing patterns, fine lines and half-tone dots after a back exposure for 15 seconds to the bottom of the sheet to establish a crosslinked base for the printing plate.

Development (washout) of the exposed sheet was then carried out in an appropriate plate washout unit equipped with brushes and temperature control, after which the plate was dried and post-exposed to harden its surface. The washout medium was 5% Cascade® in city water at 50° C. The finished photopolymer printing plate had the following properties:

| | |
|---|---|
| Washout Rate | 0.0012 in/min |
| Shore A Hardness | 52 |
| % Volume Swell @ 22° C. for 4 hours | |
| Water | 2.8 |
| 5% Ammonia Solution | 11.00 |
| Image Reproduction | Excellent |

This demonstrates that photopolymer printing plate with excellent properties is produced by the composition of our invention.

EXAMPLE 2

The following water washable photopolymer compositions were mixed in the same manner as Example 1 and compression molded into 0.067" plates by the same procedures as in Example 1.

| Formulation Component (php) | A | B |
|---|---|---|
| Flexible Polymer Blend | | |
| Flexible Polymer | | |
| CEC X56932 | 100 | — |
| Krynac X9.50 (6) | — | 100 |
| Crosslinking Agent | 30 | 30 |
| Sartomer SR9038 | | |
| Photoinitiator | 2 | 2 |
| Sartomer KB-1 | | |
| Hydrophilic Plasticizer | | |
| Carbowax PEG 20M (7) | 10 | 10 |
| Carbowax M PEG 750 | 15 | 15 |
| Hydrophobic Plasticizer | 20 | 20 |
| K-Flex DP | | |
| Surfactant | 5 | 5 |
| Tween 20 (8) | | |

(6) Carboxylated acrylonitrile butadiene rubber containing about 9.0 weight per cent bound methacrylic acid available from Bayer Corp.
(7) Proprietary ethylene glycol polymer with an average molecular weight of about 17,500 available from Union Carbide.
(8) Polyoxyethylene (20) sorbitan monolaurate available from ICI.

The resulting sheets were exposed to UV light through a black and white transparency and developed as in Example 1.

The washout medium used was a 5% mixture of Phoenix® in city water at 50° C.

The finished photopolymer printing plate had the following properties:

| | A | B |
|---|---|---|
| Washout Rate | 0.0015 in/min | 0.0008 in/min |
| Shore A Hardness | 57 | 55 |
| % Volume Swell @ 22° C. for 4 hours | | |
| Water | 15.2 | 16.1 |
| 5% Ammonia Solution | 32.5 | 34.7 |
| Image Reproduction | Excellent | Very Good |

This demonstrates that an increase in the level of the bound methacrylic acid increases the washout rate without a significant impact on the volume swell.

EXAMPLE 3

The following water washable photopolymer compositions were mixed on a two-roll open mill and compression molded into 0.067" plates by the same procedures as in Example 1.

| Formulation Component (php) | A | B | C |
|---|---|---|---|
| Flexible Polymer Blend | | | |
| Flexible Polymer | 100 | 100 | 100 |
| CEC X56932 | | | |
| Crosslinking Agent | 30 | 30 | 30 |
| Sartomer SR9038 | | | |
| Photoinitiator | 2 | 2 | 2 |
| Sartomer KB-1 | | | |
| Hydrophilic Plasticizer | | | |
| Carbowax PEG 20M | 10 | — | — |
| Carbowax M PEG 750 | — | 10 | — |
| Polyox N10 (9) | — | — | 10 |
| Hydrophobic Plasticizer | 10 | 10 | 10 |
| K-Flex DP | | | |
| Surfactant | 5 | 5 | 5 |
| Tween 20 | | | |

(9) Polyethylene oxide molecular weight 100,000 available from Union Carbide.

They were then exposed and developed by procedures similar to those used in Example 1. The washout medium was 5% Phoenix® in city water at 50° C.

The finished photopolymer printing plate had the following properties:

| | A | B | C |
|---|---|---|---|
| Washout Rate | 0.0008 in/min | 0.0010 in/min | 0.0007 in/min |
| Shore A Hardness | 58 | 53 | 55 |
| % Volume Swell @ 22° C. for 4 hours | | | |
| Water | 8.2 | 2.1 | 7.4 |
| 5% Ammonia Solution | 24.7 | 10.0 | 26.3 |
| Image Reproduction | Good | Very Good | Good |

This demonstrates that while both hydrophilic plasticizers produce acceptable printing plates, the lower molecular weight Carbowax® M PEG 750 has superior washout performance and lower volume swell.

EXAMPLE 4

The following water washable photopolymer compositions were mixed on a two-roll open mill and compression molded into 0.067" plates by the same procedures as in Example 1.

| Formulation Component (php) | A | B | C | D |
|---|---|---|---|---|
| Flexible Polymer Blend | | | | |
| Flexible Polymer | 100 | 100 | 100 | 100 |
| CEC X56932 | | | | |
| Crosslinking Agent | | | | |
| Sartomer SR9038 | 30 | — | — | — |
| Sartomer SR9035 (10) | — | 15 | 30 | — |
| Sartomer SR9003B (11) | — | 15 | — | 30 |
| Photoinitiator | 2 | 2 | 2 | 2 |
| Sartomer KB-1 | | | | |
| Hydrophilic Plasticizer | | | | |
| Carbowax PEG 20M | 10 | 10 | 10 | 10 |
| Carbowax M PEG 750 | 15 | 15 | 15 | 15 |
| Hydrophobic Plasticizer | 20 | 20 | 20 | 20 |
| K-Flex DP | | | | |
| Surfactant | 5 | 5 | 5 | 5 |
| Tween 20 | | | | |

(10) Ethoxylated trimethylol propane triacrylate (15 mols ethoxylation) available from the Sartomer Company.

(11) Propoxylated neopentyl glycol diacrylate available from the Sartomer Company.

These plates were exposed and developed by the same process as in Example 1, using 5% Phoenix® in city water at 50° C. as a washout medium.

The finished photopolymer printing plate had the following properties:

|  | A | B | C | D |
|---|---|---|---|---|
| Washout Rate | 0.0015 in/min | 0.0011 in/min | 0.0008 in/min | 0.0008 in/min |
| Shore A Hardness | 57 | 52 | 50 | 55 |
| % Volume Swell @ 22° C. for 4 hours | | | | |
| Water | 15.2 | 7.1 | 7.5 | 5.1 |
| 5% Ammonia Solution | 32.6 | 17.7 | 23.1 | 19 |
| Image Reproduction | Excellent | Fair | Fair | Poor |

This demonstrates that while it is possible to make a printing plate using solely a hydrophilic or a hydrophobic crosslinking agent, a combination of both or a single crosslinking agent, which is both hydrophilic and hydrophobic, produces the best image reproduction and washout rate.

EXAMPLE 5

The following water washable photopolymer compositions were mixed on a two-roll open mill and compression molded into 0.067" plates by the same procedures as in Example 1.

| Formulation Component (php) | A | B |
|---|---|---|
| Flexible Polymer Blend | | |
| Flexible Polymer CEC X56932 | 100 | 100 |
| Crosslinking Agent Sartomer SR9038 | 30 | 30 |
| Photoinitiator Sartomer KB-1 | 2 | 2 |
| Hydrophilic Plasticizer Carbowax M PEG 750 | 10 | 10 |
| Hydrophobic Plasticizer | | |
| DOP (12) | 10 | — |
| Plasthall TOTM (13) | — | 10 |

(12) Di-ethylhexyl phthalate
(13) Tri-octyl trimellitate available from Plasthall.

They were then exposed and developed by procedures similar to those used in Example 1. The washout medium was 5% Cascade® in city water at 50° C.

The finished photopolymer printing plate had the following properties:

|  | A | B |
|---|---|---|
| Washout Rate | 0.001 in/min | 0.001 in/min |
| Shore A Hardness | 51 | 50 |
| % Volume Swell @ 22° C. for 4 hours | | |
| Water | 3.7 | 3.6 |
| 5% Ammonia Solution | 16.8 | 12.1 |
| Image Reproduction | Very Good | Very Good |

This demonstrates other hydrophobic plasticizers are functional in the instant invention.

EXAMPLE 6

The following water washable photopolymer composition was mixed on a two-roll open mill and compression molded into 0.067" plates by the same procedures as in Example 1.

| Formulation Component (php) | |
|---|---|
| Flexible Polymer Blend | |
| Flexible Polymer CEC X56932 | 100 |
| Crosslinking Agent Sartomer SR9038 | 30 |
| Photoinitiator | |
| Sartomer KB-1 | 2 |
| Sartomer CN383 (14) | 5 |
| Hydrophilic Plasticizer Carbowax M PEG 750 | 10 |
| Hydrophobic Plasticizer K-Flex DP | 10 |

(14) Acrylated amine co-initiator available from the Sartomer Company

The plate was then exposed and developed by procedures similar to those used in Example 1. The washout medium was 5% Cascade® in city water at 50° C.

The finished photopolymer printing plate had the following properties:

| Washout Rate | 0.001 in/min |
|---|---|
| Shore A Hardness | 54 |
| % Volume Swell @ 22° C. for 4 hours | |
| Water | 4.5 |
| 5% Ammonia Solution | 17.3 |
| Image Reproduction | Very Good |

This demonstrates that co-initiators may be employed to make good photopolymer printing plates.

EXAMPLE 7

The following water washable photopolymer composition was mixed on a two-roll open mill and compression molded into 0.067" plates by the same procedures as in Example 1.

| Formulation Component (php) | |
|---|---|
| Flexible Polymer Blend | |
| Flexible Polymer CEC X56932 | 100 |
| Crosslinking Agent Sartomer SR9038 | 30 |
| Photoinitiator Sartomer KB-1 | 2 |

The plate was then exposed and developed by procedures similar to those used in Example 1. The washout medium was 5% Cascade® in city water at 50° C.

The finished photopolymer printing plate had the following properties:

| | |
|---|---|
| Washout Rate | 0.0008 in/min |
| Shore A Hardness | 54 |
| % Volume Swell @ 22° C. for 4 hours | |
| Water | 1.4 |
| 5% Ammonia Solution | 12.3 |
| Image Reproduction | Very Good |

This demonstrates that photopolymer printing plates of good quality but slow wash rate may be prepared from the flexible polymer, crosslinking agent and photoinitiator alone.

Although the present invention has been described with reference to presently preferred embodiments, it will be appreciated by those skilled in the art that various modifications, alternatives, variations, etc., may be made without departing from the spirit and scope of the invention as defined in the appended claims.

What is claimed is:

1. A flexographic photopolymer printing plate made by processing in aqueous media a photopolymer composition comprising a carboxylated acrylonitrile butadiene polymer containing about 16.8 weight percent methacrylic acid and having a Mooney ML-4 viscosity at 100° C. of less than about 80.

2. The flexographic photopolymer printing plate of claim 1 wherein said carboxylated acrylonitrile butadiene polymer also contains from about 1 to about 10 parts per hundred of at least one organic acid which contains at least three carboxyl groups.

3. The flexographic photopolymer printing plate of claim 2 wherein said at least one organic acid is citric acid.

4. The flexographic photopolymer printing plate of claim 1 wherein said carboxylated acrylonitrile butadiene polymer is comprised of repeat units which are derived from about 33 weight percent to about 77 weight percent 1,3 butadiene, from about 15 weight percent to about 45 weight percent acrylonitrile, and about 16.8 weight percent methacrylic acid, and wherein said carboxylated acrylonitrile butadiene polymer further comprises from about 1 to about 10 parts per hundred of at least one organic acid which contains at least three carboxyl groups.

5. The flexographic printing plate of claim 4 wherein said photopolymer composition further comprises a crosslinking agent, a photoinitiator, and swell enhancing components selected from the groups consisting of hydrophilic plasticizers, hydrophobic plasticizers, surfactants, and mixtures thereof.

6. The flexographic printing plate of claim 5 wherein said hydrophilic plasticizers are selected from the group consisting of ethylene oxide condensates, propoxylated polyglycols and other polypropylene oxides condensates, methoxy polyethylene glycol, blends of ethoxylated and propoxylated polyglycols, and amino polyglycols, and said hydrophobic plasticizers are selected from the group consisting of glycol esters, thioglycol esters, and aromatic esters.

7. A flexograhic photopolymer printing plate made by processing in aqueous media a photopolymer composition comprising:
1) a carboxylated acrylonitrile butadiene polymer containing about 8–22 weight percent methacrylic acid and having a Mooney ML-4 viscosity at 100° C. of less than about 80,
2) an ethoxylated bisphenol A diacrylate crosslinking agent,
3) a benzyl dimethal ketal photoinitiator, and
4) swell enhancing components which include a hydrophilic plasticizer selected from the group consisting an ethyoxylated polyglycol having a molecular weight of about 400, methoxy polyethylene glycol having a molecular weight about 750, an ethylene glycol polymer with an average molecular weight of about 17,500, and polyethylene oxide and a hydrophobic plasticizer selected from the group consisting of dipropylene glycol dibenzoate, di-ethylhexyl phthalate, and tri-octyl trimellitate.

8. The flexographic printing plate of claim 7 wherein said photopolymer composition comprises carboxylated acrylonitrile butadiene polymer, from about 10 to about 60 parts per hundred polymer of ethoxylated bisphenol A diacrylate, from about 0.5 to about 5 parts per hundred polymer of benzyl dimethal ketal, from about 1 to about 100 parts per hundred polymer of hydrophilic plasticizers and from about 5 to about 25 parts per hundred polymer of hydrophobic plasticizers.

9. The flexographic printing plate of claim 8 wherein said photopolymer composition further comprises from about 1 to about 10 parts per hundred polymer of polyoxyethylene (20) sorbitan monolaurate surfactant as a swell enhancing component.

10. A flexographic photopolymer printing plate made by processing in aqueous media a photopolymer composition comprising:
1) a hydrophilic flexible polymer,
2) a crosslinking agent, a photoinitiator and swell enhancing components comprising a hydrophilic plasticizer selected from the group consisting of an ethyoxylated polyglycol having a molecular weight of about 400, methoxy polyethylene glycol having a molecular weight of about 750, an ethylene glycol polymer with an average molecular weight of about 17,500, a polyethylene oxide, and combinations thereof, and a hydrophobic plasticizer selected from the group consisting of dipropylene glycol dibenzoate, di-ethyl hexyl phthalate and tri-octyl trimellitate.

11. The flexographic photopolymer printing plate of claim 10 wherein said crosslinking agent is an ethoxylated bisphenol A diacrylate.

12. The flexographic photopolymer printing plate of claim 10 wherein said hydrophilic flexible polymer is a carboxylated acrylonitrile butadiene polymer.

13. The flexographic photopolymer printing plate of claim 10 wherein said swell enhancing components further include from about 1 to about 10 parts per hundred polymer of polyoxyethylene (20) sorbitan monolaurate surfactant.

14. The flexographic photopolymer printing plate of claim 13 wherein said hydrophilic plasticizer is a mixture of methoxy polyethylene glycol having a molecular weight of about 750 and an ethylene glycol polymer with an average molecular weight of about 17,500.

15. A flexographic photopolymer printing plate made by processing in aqueous media a photopolymer composition comprising:
1) a carboxylated acrylonitrile butadiene polymer containing about 16.8 weight percent methacrylic acid and having a Mooney ML-4 viscosity at 100° C. of less than about 80,
2) an ethoxylated bisphenol A diacrylate crosslinking agent,
3) a photoinitiator and
4) swell enhancing components.

16. The flexographic photopolymer printing plate of claim 15 wherein said photopolymer composition contains a combination of a hydrophilic ethylenically unsaturated crosslinking agent and a hydrophobic ethylenically unsaturated crosslinking agent.

17. The flexographic photopolymer printing plate of claim 16 wherein said hydrophobic ethylenically unsaturated crosslinking agent is present in an amount of about 5 to about 30 parts per hundred polymer and said hydrophobic ethylenically unsaturated crosslinking agent is present in an amount of about 5 to about 30 parts per hundred polymer.

* * * * *